(12) United States Patent
Kim

(10) Patent No.: US 11,114,142 B2
(45) Date of Patent: Sep. 7, 2021

(54) REFERENCE VOLTAGE TRAINING CIRCUIT AND SEMICONDUCTOR APPARATUS INCLUDING THE SAME

(71) Applicant: SK hynix Inc., Gyeonggi-do (KR)

(72) Inventor: Hee Jun Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/862,172

(22) Filed: Apr. 29, 2020

(65) Prior Publication Data
US 2021/0098039 A1 Apr. 1, 2021

(30) Foreign Application Priority Data
Sep. 26, 2019 (KR) .......................... 10-2019-0118822

(51) Int. Cl.
| | |
|---|---|
| *G11C 8/00* | (2006.01) |
| *G11C 7/22* | (2006.01) |
| *G11C 7/06* | (2006.01) |
| *G11C 7/14* | (2006.01) |
| *G11C 7/10* | (2006.01) |

(52) U.S. Cl.
CPC .............. *G11C 7/222* (2013.01); *G11C 7/062* (2013.01); *G11C 7/1012* (2013.01); *G11C 7/14* (2013.01)

(58) Field of Classification Search
CPC ....... G11C 7/222; G11C 7/062; G11C 7/1012; G11C 7/14
USPC ...................................... 365/233.1
See application file for complete search history.

(56) References Cited

U.S. PATENT DOCUMENTS 9,496,008 B1* 11/2016 Braendli .................. G11C 7/14
2015/0205312 A1* 7/2015 Hyun ..................... G05F 1/468
327/540

FOREIGN PATENT DOCUMENTS

| KR | 10-1004664 | 1/2011 |
|---|---|---|
| KR | 10-2015-0089122 | 8/2015 |

\* cited by examiner

*Primary Examiner* — Huan Hoang
(74) *Attorney, Agent, or Firm* — IP & T Group LLP

(57) ABSTRACT

A reference voltage training circuit may include: a normal buffer configured to generate a first received signal by receiving one of differential signals based on the other; a calibration signal generation circuit configured to generate a second received signal by receiving the one of the differential signals according to a reference voltage, and generate reference voltage calibration signals by comparing the phase of the second received signal to the phase of the first received signal; and a reference voltage generation circuit configured to calibrate the level of the reference voltage according to the reference voltage calibration signals.

20 Claims, 4 Drawing Sheets

REFERENCE VOLTAGE TRAINING CIRCUIT AND SEMICONDUCTOR APPARATUS INCLUDING THE SAME

CROSS-REFERENCE TO RELATED APPLICATION

The present application claims priority under 35 U.S.C. § 119(a) to Korean application number 10-2019-0118822, filed on Sep. 26, 2019, in the Korean Intellectual Property Office, which is incorporated herein by reference in its entirety.

BACKGROUND

1. Technical Field

Various embodiments generally relate to a semiconductor circuit, and more particularly, to a reference voltage training circuit and a semiconductor apparatus including the same.

2. Related Art

A first semiconductor apparatus may exchange data with a second semiconductor apparatus through a channel.

Between the first and second semiconductor apparatuses, one may be a semiconductor memory, and the other may be a memory controller.

The first semiconductor apparatus may generate a reference signal for data transmission, for example, a data strobe signal, and transmit the reference signal with data to the second semiconductor apparatus.

Data transmitted through a channel may contain noise which is caused by various factors, for example, channel loss, skew, cross-talk and ISI (Inter Symbol Interference).

SUMMARY

Various embodiments are directed to a reference voltage training circuit capable of raising data receiving performance and a semiconductor apparatus including the same.

In an embodiment, a reference voltage training circuit may include: a normal buffer configured to generate a first received signal first received signal by receiving one of differential signals based on the other; a calibration signal generation circuit configured to generate a second received signal by receiving the one of the differential signals according to a reference voltage, and generate reference voltage calibration signals by comparing the phase of the second received signal to the phase of the first received signal; and a reference voltage generation circuit configured to calibrate the level of the reference voltage according to the reference voltage calibration signals.

In an embodiment, a semiconductor apparatus may include: a differential signal receiving circuit configured to generate reference voltage calibration signals according to differential signals and a reference voltage; a data receiving circuit configured to receive data transmitted from an external semiconductor apparatus according to the reference voltage; and a reference voltage generation circuit configured to calibrate the level of the reference voltage according to the reference voltage calibration signals.

DETAILED DESCRIPTION

Hereinafter, a reference voltage training circuit and a semiconductor apparatus including the same according to the present disclosure are described with reference to the accompanying drawings through various embodiments. Throughout the specification, reference to "an embodiment" or the like is not necessarily to only one embodiment, and different references to any such phrase are not necessarily to the same embodiment(s).

Figure 1:
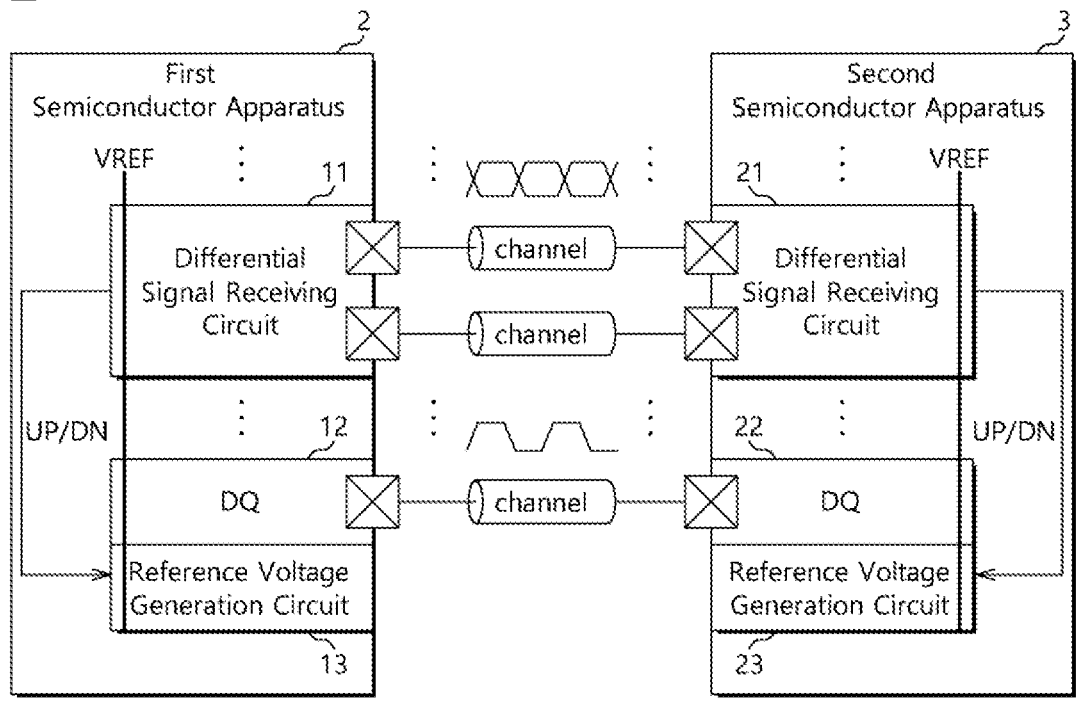
FIG. 1 is a diagram illustrating a configuration of a semiconductor system in accordance with an embodiment.

FIG. 1 is a diagram illustrating a configuration of a semiconductor system in accordance with an embodiment.

Referring to FIG. 1, the semiconductor system 1 may include a first semiconductor apparatus 2 and a second semiconductor apparatus 3.

The semiconductor system may include an SSD (Solid State Drive), for example.

Between the first and second semiconductor apparatuses 2 and 3, one may be a semiconductor memory, and the other may be a memory controller.

For example, suppose that the first semiconductor apparatus 2 is a memory controller, and the second semiconductor apparatus 3 is a semiconductor memory. During a read operation, the second semiconductor apparatus 3 may transmit data DQ and differential data strobe signals DQS_T and DQS_C, which may be used as reference signals for data receiving timings, to the first semiconductor apparatus 2 through respective channels.

The first semiconductor apparatus 2 may receive the data DQ according to the differential data strobe signals DQS_T and DQS_C, and determine the logical values of the received data DQ according to a reference voltage VREF.

The first semiconductor apparatus 2 may include a differential signal receiving circuit 11, a data receiving circuit 12 and a reference voltage generation circuit 13.

The differential signal receiving circuit 11 may receive differential signals, for example, the differential data strobe signals DQS_T and DQS_C, from the second semiconductor apparatus 3 through the channels.

The differential signal receiving circuit 11 may generate reference voltage calibration signals UP/DN according to the differential data strobe signals DQS_T and DQS_C and the reference voltage VREF.

The differential signal receiving circuit 11 may receive any one of the differential data strobe signals DQS_T and DQS_C (for example, DQS_C) as a first received signal based on the other differential data strobe signal (for example, DQS_T) and receive the other differential data strobe signal (for example, DQS_T) as a second received signal based on the reference voltage VREF, and generate the reference voltage calibration signals UP/DN by comparing the phases of the first and second received signals.

The data receiving circuit 12 may receive the data DQ transmitted from the second semiconductor apparatus 3 through the channels according to the reference voltage VREF.

The reference voltage generation circuit 13 may calibrate the level of the reference voltage VREF according to the reference voltage calibration signals UP/DN.

The reference voltage generation circuit 13 may raise the level of the reference voltage VREF according to the reference voltage calibration signal UP.

The reference voltage generation circuit 13 may lower the level of the reference voltage VREF according to the reference voltage calibration signal DN.

The second semiconductor apparatus 3 may include a differential signal receiving circuit 21, a data receiving circuit 22 and a reference voltage generation circuit 23.

The differential signal receiving circuit 21 may receive the differential data strobe signals DQS_T and DQS_C from the first semiconductor apparatus 2 through the channels.

The differential signal receiving circuit 21 may generate a reference voltage calibration signals UP/DN according to the differential data strobe signals DQS_T and DQS_C and the reference voltage VREF.

The differential signal receiving circuit 21 may receive any one of the differential data strobe signals DQS_T and DQS_C (for example, DQS_C) as the first received signal based on the other differential data strobe signal (for example, DQS_T) and receive the other differential data strobe signal (for example, DQS_T) as the second received signal based on the reference voltage VREF, and generate the reference voltage calibration signals UP/DN by comparing the phases of the first and second received signals.

The data receiving circuit 22 may receive the data DQ transmitted from the first semiconductor apparatus 2 through the channels according to the reference voltage VREF.

The reference voltage generation circuit 23 may calibrate the level of the reference voltage VREF according to the reference voltage calibration signal UP/DN.

The reference voltage generation circuit 23 may increase the level of the reference voltage VREF according to the reference voltage calibration signal UP.

The reference voltage generation circuit 23 may decrease the level of the reference voltage VREF according to the reference voltage calibration signal DN.

Figure 2:
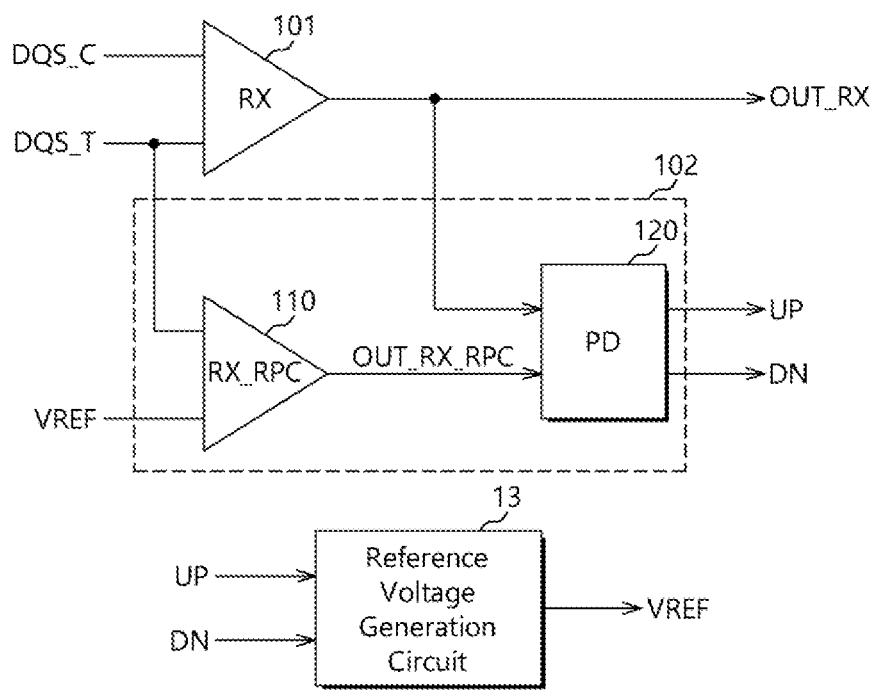
FIG. 2 is a diagram illustrating a configuration of a reference voltage training circuit in accordance with an embodiment.

FIG. 2 is a diagram illustrating a configuration of a reference voltage training circuit in accordance with an embodiment.

The reference voltage training circuit may be included in either or both of the first and second semiconductor apparatuses 2 and 3 of FIG. 1.

A configuration of the reference voltage training circuit included in the first semiconductor apparatus 2 is described below as an example.

Referring to FIG. 2, the reference voltage training circuit 100 may include a normal buffer RX 101, a calibration signal generation circuit 102 and a reference voltage generation circuit 13.

The normal buffer 101 may receive any one of the differential data strobe signals DQS_T and DQS_C based on the other differential data strobe signal, and generate a first received signal OUT_RX.

The calibration signal generation circuit 102 may receive the other differential data strobe signal DQS_T of the differential data strobe signals DQS_T and DQS_C as a second received signal OUT_RX_RPC based on the reference voltage VREF, and generate the reference voltage calibration signals UP/DN by comparing the phase of the second received signal OUT_RX_RPC to the phase of the first received signal OUT_RX.

The calibration signal generation circuit 102 may include a replica buffer RX_RPC 110 and a phase detector PD 120.

The replica buffer 110 may be configured by replicating the normal buffer 101. That is, configurations of the normal buffer 101 and the replica buffer 110 may be substantially the same.

The replica buffer 110 may receive the other differential data strobe signal DQS_T of the differential data strobe signals DQS_T and DQS_C based on the reference voltage VREF, and generate the second received signal OUT_RX_RPC.

The phase detector 120 may generate the reference voltage calibration signals UP/DN by comparing the phases of the first and second received signals OUT_RX and OUT_RX_RPC.

The reference voltage generation circuit 13 may calibrate the level of the reference voltage VREF according to the reference voltage calibration signals UP/DN.

The reference voltage generation circuit 13 of FIG. 2 may be used as the reference voltage generation circuit 13 of FIG. 1.

Figure 3:
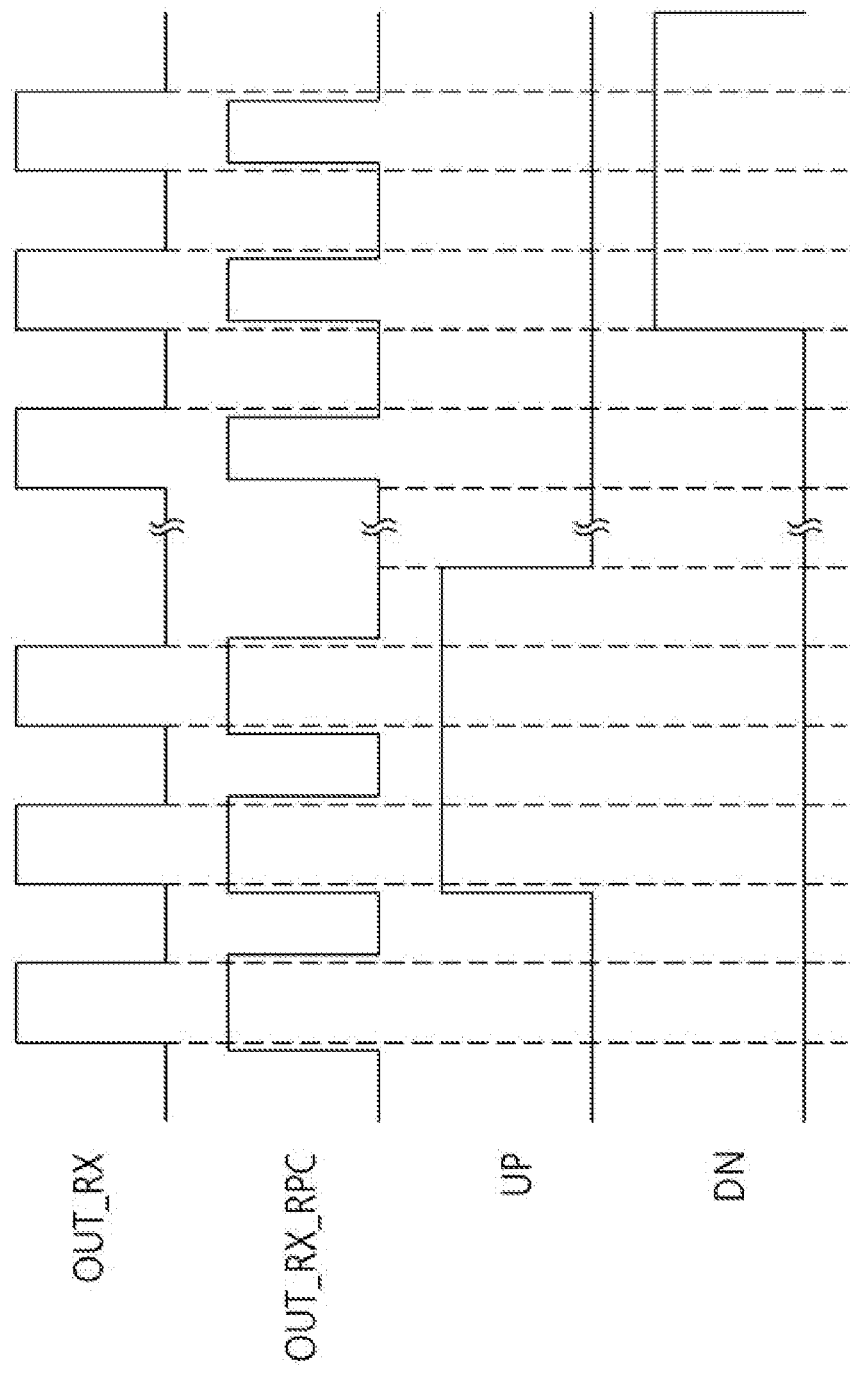
FIG. 3 is a timing diagram illustrating an operation of a calibration signal generation circuit, such as that of FIG. 2.

FIG. 3 is a timing diagram illustrating the operation of the calibration signal generation circuit of FIG. 2.

Referring to FIG. 3, when the phase of the second received signal OUT_RX_RPC leads the phase of the first received signal OUT_RX, the phase detector 120 may change the UP signal of the reference voltage calibration signals UP/DN to a high level.

When the phase of the second received signal OUT_RX_RPC leads the phase of the first received signal OUT_RX, the phase detector 120 may change the UP signal to a high level at a rising edge of a second pulse of the second received signal OUT_RX_RPC.

When the phase of the first received signal OUT_RX leads the phase of the phase of the second received signal OUT_RX_RPC, the phase detector 120 may change the DN signal of the reference voltage calibration signals UP/DN to a high level.

After the phases of the first received signal OUT_RX and the second received signal OUT_RX_RPC switch such that OUT_RX leads OUT_RX_RPC, the phase detector 120 may change the DN signal to a high level at a rising edge of a second pulse of the first received signal OUT_RX after the phase reversal.

For example, it is assumed that the phase detector 120 is configured to change the UP or DN signal to a high level at a rising edge of a first pulse of one signal of the first and second received signals OUT_RX and OUT_RX_RPC, which leads the other signal.

When the phases of the first and second received signals OUT_RX and OUT_RX_RPC alternately lead each other due to temporary or transient noise, the UP signal and the DN signal may alternately transition to a high level.

As the UP signal and the DN signal alternately transition to a high level, the level of the reference voltage VREF may be repeatedly raised and lowered, and thus retained at the original level. Therefore, the level of the reference voltage VREF may be unnecessarily calibrated.

Therefore, in an embodiment, the phase detector 120 is configured to change the UP or DN signal to a high level at a rising edge of a second pulse of one signal of the first and second received signals OUT_RX and OUT_RX_RPC, which leads the other signal, such that the reference voltage VREF is not unnecessarily calibrated.

Figure 4:
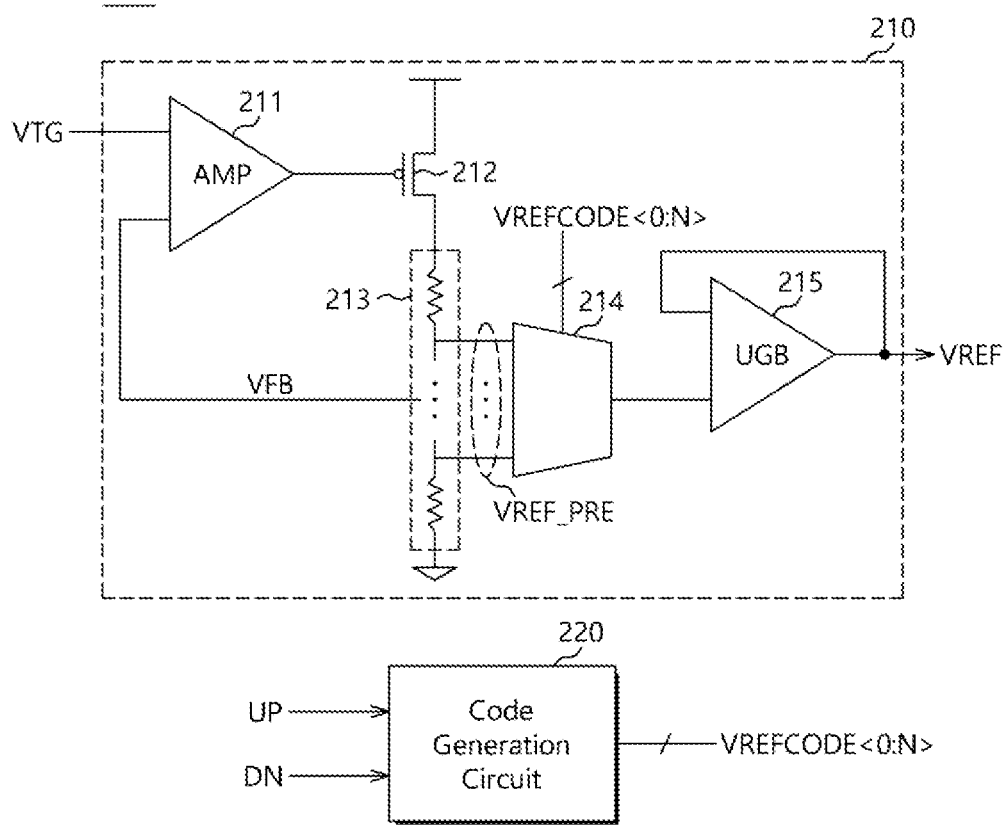
FIG. 4 is a diagram illustrating a configuration of a reference voltage generation circuit, such as that of FIG. 2.

FIG. 4 is a diagram illustrating a configuration of the reference voltage generation circuit of FIG. 2.

Referring to FIG. 4, the reference voltage generation circuit 13 may include a voltage generation circuit 210 and a code generation circuit 220.

The voltage generation circuit 210 may generate pre-reference voltages VREF_PRE using a supply voltage according to a target voltage VTG, select one of the pre-reference voltages VREF_PRE according to a voltage calibration code VREFCODE<0:N>, and output the selected voltage as the reference voltage VREF.

The target voltage VTG may be set to a level corresponding to half of the supply voltage, for example.

The voltage generation circuit 210 may include an amplifier 211, a driver 212, a divider resistor (or voltage divider) 213, a multiplexer 214 and a buffer UGB 215.

The amplifier 211 may amplify and output a difference between the target voltage VTG and a feedback voltage VFB.

The driver 212 may be coupled to a supply voltage terminal.

The divider resistor 213 may be coupled between the driver 212 and a ground voltage terminal.

The driver 212 may include a PMOS transistor.

The driver 212 may have a gate terminal configured to receive the output of the amplifier 211, a source terminal configured to receive the supply voltage, and a drain terminal coupled to the divider resistor 213.

The driver 212 may calibrate the amount of current flowing through the divider resistor 213 according to the output of the amplifier 211.

One of the pre-reference voltages VREF_PRE applied to nodes of the divider resistor 213 may be provided as the feedback voltage VFB to the amplifier 211.

The multiplexer 214 may select and output one of the pre-reference voltages VREF_PRE according to the voltage calibration code VREFCODE<0:N>.

The buffer 215 may be configured as a unit gain buffer, and output the output of the multiplexer 214 as the reference voltage VREF.

The code generation circuit 220 may generate the voltage calibration code VREFCODE<0:N> according to the reference voltage calibration signals UP/DN.

The code generation circuit 220 may increase a value of the voltage calibration code VREFCODE<0:N> according to the reference voltage calibration signal UP, and decrease the value of the voltage calibration code VREFCODE<0:N> according to the reference voltage calibration signal DN.

As the value of the voltage calibration code VREFCODE<0:N> is increased, a voltage having a level higher than the level of a voltage selected according to the value of a previous voltage calibration code VREFCODE<0:N> may be selected among the pre-reference voltages VREF_PRE.

As the value of the voltage calibration code VREFCODE<0:N> is decreased, a voltage having a level lower than the level of the voltage selected according to the value of a previous voltage calibration code VREFCODE<0:N> may be selected among the pre-reference voltages VREF_PRE.

The code generation circuit 220 may include a register for storing a code value and a counter for increasing/decreasing a register value.

Figure 5:
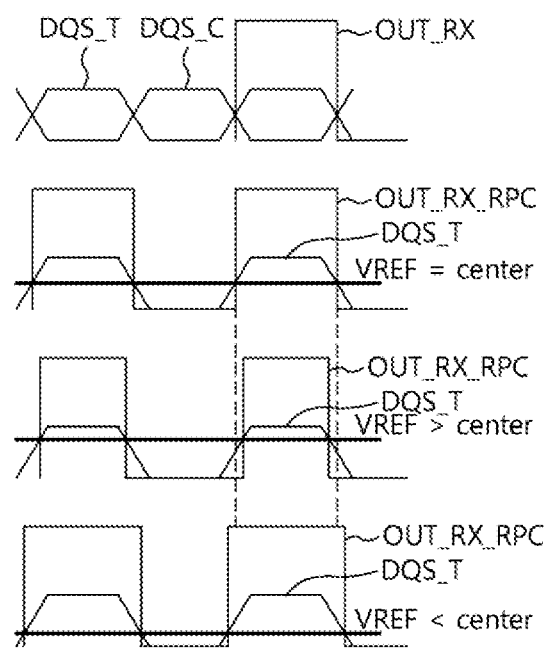
FIG. 5 is a timing diagram illustrating a reference voltage training method in accordance with an embodiment.

FIG. 5 is a timing diagram illustrating a reference voltage training method in accordance with an embodiment.

Hereafter, the reference voltage training method is described with reference to FIG. 5.

The differential signals including the differential data strobe signals DQS_T and DQS_C in accordance with an embodiment have a complementary relationship.

Cross points between the differential signals may be matched with mid-levels of the differential signals.

Cross points between the differential data strobe signals DQS_T and DQS_C may be matched with mid-levels of the differential data strobe signals DQS_T and DQS_C.

Since the first received signal OUT_RX is generated according to the differential data strobe signals DQS_T and DQS_C, the first received signal OUT_RX may have a width corresponding to the cross-points between the differential data strobe signals DQS_T and DQS_C.

The semiconductor apparatuses, i.e., the first and second semiconductor apparatuses 2 and 3 of FIG. 1, may commonly receive the data DQ based on the differential data strobe signals DQS_T and DQS_C, and determine the logical values of the data DQ according to the reference voltage VREF.

When the level of the reference voltage VREF is calibrated to have a value corresponding to the center of the mid-level of the RX signal, the data receiving performance may be optimized.

The second received signal OUT_RX_RPC may be generated according to the reference voltage VREF and the differential data strobe signal DQS_T.

The second received signal OUT_RX_RPC may have the same width as the first received signal OUT_RX under a condition that the level of the reference voltage VREF is the same or substantially the same as the mid-level of differential data strobe signals DQS_T and DQS_C (illustrated as VREF=Center in FIG. 5).

Compared to the condition of VREF=Center, the width of the second received signal OUT_RX_RPC may be decreased under a condition that the level of reference voltage VREF is greater than the mid-level of the differential data strobe signals DQS_T and DQS_C (illustrated as VREF>Center in FIG. 5), and increased under a condition that the level of the reference voltage VREF is less than the mid-level of the differential data strobe signals DQS_T and DQS_C (illustrated as VREF<Center in FIG. 5).

Although the semiconductor apparatus is designed to satisfy the condition of VREF=Center, data transmitted from the outside may contain noise due to various environmental factors. In this case, the semiconductor apparatus may not satisfy the condition of VREF=Center.

The semiconductor apparatus in accordance with an embodiment may determine whether the condition of VREF=Center is satisfied according to a phase difference between the first and second received signals OUT_RX and OUT_RX_RPC in real time. Furthermore, the semiconductor apparatus may calibrate the level of the reference voltage VREF to satisfy the condition of VREF=Center, according to the reference voltage calibration signals UP/DN which is generated based on a phase difference between the first and second received signals OUT_RX and OUT_RX_RPC, thereby improving the data receiving performance, even in the presence of noise.

While various embodiments have been illustrated and described, it will be understood to those skilled in the art that the embodiments described are examples only. Accordingly, the present invention is not limited to or by any of the described embodiments. Rather, the present invention encompasses all variations and modifications of any disclosed embodiment that fall within the scope of the claims.

What is claimed is:

1. A reference voltage training circuit comprising:
 a normal buffer configured to generate a first received signal by receiving one of two differential signals based on the other of the two differential signals;
 a calibration signal generation circuit configured to generate a second received signal by receiving the one of the differential signals according to a reference voltage, and generate reference voltage calibration signals by comparing a phase of the second received signal with a phase of the first received signal; and a reference voltage generation circuit configured to calibrate a level of the reference voltage according to the reference voltage calibration signals.

2. The reference voltage training circuit according to claim 1, wherein the calibration signal generation circuit comprises:

a replica buffer configured to receive the one of the differential signals according to the reference voltage and generate the second received signal; and a phase detector configured to generate the reference voltage calibration signals by comparing the phase of the second received signal to the phase of the first received signal.

3. The reference voltage training circuit according to claim 2, wherein the replica buffer is configured by replicating the normal buffer.

4. The reference voltage training circuit according to claim 2, wherein when the phase of the second received signal leads the phase of the first received signal, the phase detector changes one of the reference voltage calibration signals to a high level at a rising edge of a second pulse of the second received signal.

5. The reference voltage training circuit according to claim 4, wherein when the phase of the first received signal leads the phase of the second received signal, the phase detector changes the other of the reference voltage calibration signals to a high level at a rising edge of a second pulse of the first received signal.

6. The reference voltage training circuit according to claim 1, wherein the reference voltage generation circuit comprises:

a voltage generation circuit configured to generate pre-reference voltages using a supply voltage according to a target voltage, select one of the pre-reference voltages according to a voltage calibration code, and output the selected voltage as the reference voltage; and a code generation circuit configured to generate the value of the voltage calibration code according to the reference voltage calibration signal.

7. The reference voltage training circuit according to claim 6, wherein the voltage generation circuit comprises:

an amplifier configured to amplify and output a difference between the target voltage and a feedback voltage;

a driver coupled to a supply voltage terminal;

a divider resistor coupled between the driver and a ground voltage terminal and configured to provide to the amplifier one of the pre-reference voltages applied to nodes as the feedback voltage; and a multiplexer configured to select and output, as the reference voltage, one of the pre-reference voltages according to the voltage calibration code.

8. The reference voltage training circuit according to claim 1, wherein the differential signals comprise differential data strobe signals.

9. A semiconductor apparatus comprising:

a differential signal receiving circuit configured to generate reference voltage calibration signals according to differential signals and a reference voltage;

a data receiving circuit configured to receive data transmitted from an external semiconductor apparatus according to the reference voltage; and a reference voltage generation circuit configured to calibrate a level of the reference voltage according to the reference voltage calibration signals.

10. The semiconductor apparatus according to claim 9, wherein the differential signals comprise differential data strobe signals.

11. The semiconductor apparatus according to claim 9, wherein the differential signal receiving circuit:

receives a first of the differential signals as a first received signal based on a second of the differential signals, receives the first differential signal as a second received signal based on the reference voltage, and generates the reference voltage calibration signals by comparing a phase of the first received signal to a phase of the second received signal.

12. The semiconductor apparatus according to claim 9, wherein the differential signal receiving circuit comprises:

a normal buffer configured to receive the first differential signal based on the second differential signal and generate the first received signal;

a replica buffer configured to generate the second received signal by receiving the first differential signal according to the reference voltage; and a phase detector configured to generate the reference voltage calibration signals by comparing the phase of the second received signal to the phase of the first received signal.

13. The semiconductor apparatus according to claim 12, wherein the replica buffer is configured by replicating the normal buffer.

14. The semiconductor apparatus according to claim 12, wherein when the phase of the second received signal leads the phase of the first received signal, the phase detector changes one of the reference voltage calibration signals to a high level at a rising edge of a second pulse of the second received signal.

15. The semiconductor apparatus according to claim 14, wherein when the phase of the first received signal leads the phase of the second received signal, the phase detector changes the other of the reference voltage calibration signals to a high level at a rising edge of a second pulse of the first received signal.

16. The semiconductor apparatus according to claim 9, wherein the reference voltage generation circuit comprises:

a voltage generation circuit configured to generate pre-reference voltages using a supply voltage according to a target voltage, select one of the pre-reference voltages according to a voltage calibration code, and output the selected voltage as the reference voltage; and a code generation circuit configured to generate the voltage calibration code according to the reference voltage calibration signals.

17. The semiconductor apparatus according to claim 16, wherein the voltage generation circuit comprises:

an amplifier configured to amplify and output a difference between the target voltage and a feedback voltage;

a driver coupled to a supply voltage terminal;

a divider resistor coupled between the driver and a ground voltage terminal and configured to provide the amplifier one of the pre-reference voltages applied to nodes as the feedback voltage; and a multiplexer configured to select and output, as the reference voltage, one of the pre-reference voltages according to the voltage calibration code.

18. A reference voltage training circuit comprising:

first circuitry configured to generate a first signal by comparing levels of differential signals;

second circuitry configured to generate a second signal by comparing a level of a reference signal with a level of one of the differential signals;

third circuitry configured to generate a calibration code by comparing phases of the first and second signals; and fourth circuitry configured to move, according to the calibration code, a level of the reference signal toward a mid-level of the differential signals.

19. The reference voltage training circuit according to claim 18, wherein when the phase of the second signal leads the phase of the first signal, the third circuitry changes one of the calibration code to a high level at a rising edge of a second pulse of the second signal.

20. The reference voltage training circuit according to claim 19, wherein when the phase of the first signal leads the phase of the second signal, the third circuitry changes the other of the calibration code to a high level at a rising edge of a second pulse of the first signal.

* * * * *